United States Patent
Li et al.

(10) Patent No.: US 8,650,355 B2
(45) Date of Patent: Feb. 11, 2014

(54) NON-VOLATILE RESISTIVE SENSE MEMORY ON-CHIP CACHE

(75) Inventors: Hai Li, Eden Prairie, MN (US); Yiran Chen, Eden Prairie, MN (US); Hongyue Liu, Maple Grove, MN (US); Henry F. Huang, Apple Valley, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 962 days.

(21) Appl. No.: 12/252,027

(22) Filed: Oct. 15, 2008

(65) Prior Publication Data

US 2010/0095057 A1  Apr. 15, 2010

(51) Int. Cl.
*G06F 12/00* (2006.01)
*G06F 13/00* (2006.01)
*G06F 13/28* (2006.01)

(52) U.S. Cl.
USPC .................................. 711/104; 711/E12.017

(58) Field of Classification Search
USPC .......................................... 711/104, E12.017
See application file for complete search history.

(56) References Cited

U.S. PATENT DOCUMENTS

| | | | |
|---|---|---|---|
| 5,200,631 A * | 4/1993 | Austin et al. .................. 257/570 |
| 6,304,477 B1 * | 10/2001 | Naji ................................. 365/50 |
| 6,400,593 B1 | 6/2002 | Lien et al. | |
| 6,452,823 B1 | 9/2002 | Naji | |
| 6,567,307 B1 | 5/2003 | Estakhri | |
| 6,763,424 B2 | 7/2004 | Conley | |
| 6,823,434 B1 | 11/2004 | Hannum et al. | |
| 7,009,877 B1 | 3/2006 | Huai | |
| 7,098,494 B2 | 8/2006 | Pakala | |
| 7,187,577 B1 | 3/2007 | Wang | |
| 7,196,354 B1 * | 3/2007 | Erchak et al. ................... 257/79 |
| 7,224,601 B2 | 5/2007 | Panchula | |
| 7,272,034 B1 | 9/2007 | Chen | |
| 7,272,035 B1 | 9/2007 | Chen | |
| 7,282,755 B2 | 10/2007 | Pakala | |
| 7,286,394 B2 | 10/2007 | Ooishi | |
| 7,286,395 B2 | 10/2007 | Chen | |
| 7,289,356 B2 | 10/2007 | Diao | |
| 7,345,912 B2 | 3/2008 | Luo et al. | |
| 7,379,327 B2 | 5/2008 | Chen | |
| 7,395,404 B2 | 7/2008 | Gorobets et al. | |
| 7,502,249 B1 | 3/2009 | Ding | |

(Continued)

OTHER PUBLICATIONS

Fred Fishburn, Ralph Kauffman, Richard Lane, Terry McDaniel, Kevin Schofield, Scott Southwick, Ray Turi & Hongmei Wang; "A highly manufacturable 110nm EDRAM process with Al2O3 stack MIM capacitor for cost effective high density, high speed, low voltage ASIC memory applications," 2003 Symposium on VLSI Technology Digest of Technical Papers, 2003, 75-76, Micron Technology, Boise, ID.

(Continued)

*Primary Examiner* — Sheng-Jen Tsai
(74) *Attorney, Agent, or Firm* — Hall Estill Attorneys at Law

(57) ABSTRACT

Various embodiments of the present invention are generally directed to a non-volatile resistive sense memory on-chip cache. In accordance with some embodiments, a processing circuit is formed on a first semiconductor substrate. A second semiconductor substrate is affixed to the first semiconductor substrate to form an encapsulated integrated chip package, wherein a non-volatile storage array of resistive sense memory (RSM) cells is formed on the second semiconductor substrate to cache data used by the processing circuit.

17 Claims, 6 Drawing Sheets

(56) References Cited

U.S. PATENT DOCUMENTS

| | | | |
|---|---|---|---|
| 7,515,457 B2 | 4/2009 | Chen | |
| 7,711,923 B2 | 5/2010 | Rogers et al. | |
| 8,135,763 B1 | 3/2012 | Compton et al. | |
| 2003/0218927 A1* | 11/2003 | Mayer et al. | 365/200 |
| 2005/0177679 A1* | 8/2005 | Alva et al. | 711/104 |
| 2005/0254295 A1* | 11/2005 | Nazarian | 365/173 |
| 2006/0044881 A1 | 3/2006 | Tran et al. | |
| 2006/0256610 A1* | 11/2006 | Qureshi et al. | 365/158 |
| 2007/0152344 A1* | 7/2007 | Zingher et al. | 257/777 |
| 2008/0056023 A1 | 3/2008 | Lee et al. | |
| 2008/0114930 A1* | 5/2008 | Sanvido et al. | 711/113 |
| 2008/0266991 A1* | 10/2008 | Lee et al. | 365/203 |
| 2008/0273380 A1 | 11/2008 | Diao | |
| 2008/0310213 A1 | 12/2008 | Chen | |
| 2008/0310219 A1 | 12/2008 | Chen | |
| 2009/0032966 A1* | 2/2009 | Lee et al. | 257/774 |
| 2009/0040855 A1 | 2/2009 | Luo | |
| 2009/0185410 A1 | 7/2009 | Huai | |
| 2009/0316499 A1* | 12/2009 | Hidaka | 365/189.011 |
| 2009/0323384 A1* | 12/2009 | Lam et al. | 365/49.17 |
| 2010/0095057 A1 | 4/2010 | Li et al. | |
| 2011/0080767 A1* | 4/2011 | Rinerson et al. | 365/148 |
| 2011/0090732 A1* | 4/2011 | Li et al. | 365/158 |

OTHER PUBLICATIONS

"CMOS—Compatible Process—A Deeper Look at eDRAM Cell Structure," NEC Electronics, 1995-2008, 1-3.

Amit Agarwal, Bipul C. Paul, Hamid Mahmoodi, Animesh Datta & Kaushik Roy, "A Process-Tolerant Cache Architecture for Improved Yield in Nanoscale Technologies," IEEE Transactions in Very Large Scale Integration (VLSI) Systems, Jan. 2005, 27-38, vol. 13, No. 1, US.

Doug Burger & Todd M. Austin, "The SimpleScalar Tool Set, Version 2.0," University of Wisconsin-Madison Computer Sciences Department Technical Report, Jun. 1997, 1-21, #1342, US.

Kostas Pagiamtzis and Ali Sheikholeslami, "Content-Addressable Memory (CAM) Circuits and Architectures: A Tutorial and Survey," IEEE Journal of Solid State Circuits, Mar. 2006, pp. 712-727, vol. 41, No. 3, IEEE.

* cited by examiner

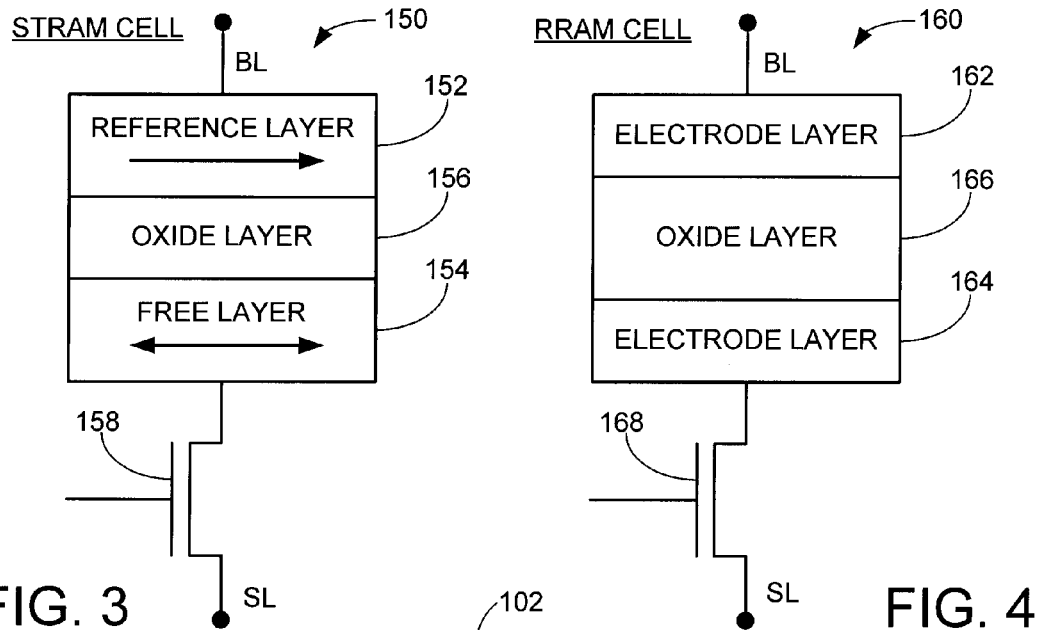
FIG. 3
FIG. 4
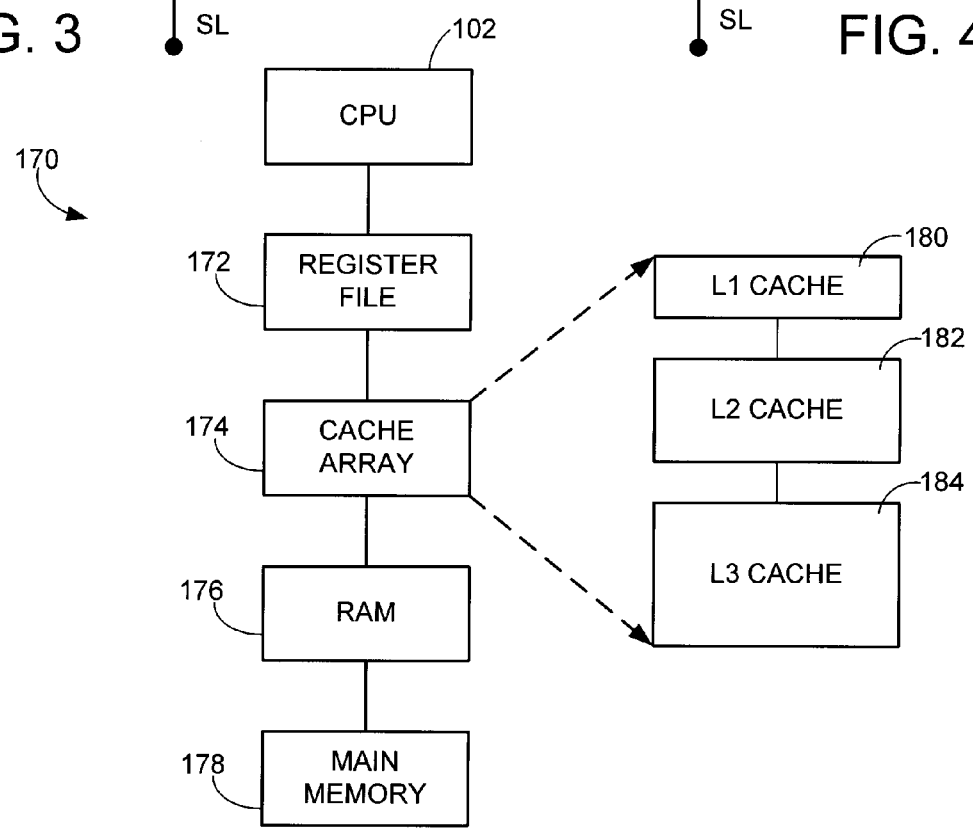
FIG. 5

NON-VOLATILE RESISTIVE SENSE MEMORY ON-CHIP CACHE

BACKGROUND

Data storage devices generally operate to store and retrieve data in a fast and efficient manner. A top level controller, such as a programmable processor (CPU), can utilize a hierarchical memory structure to manage data during such transfers with a main memory of the device, such as a semiconductor array of non-volatile memory cells, magnetic media, etc.

Such hierarchical memory structures can include cache, which generally comprises one or more relatively small memory blocks of relatively high speed memory operationally proximate the controller. The cache is generally used to maintain processing efficiencies of the controller as high as possible by minimizing the wait times required to access the relatively slower main memory.

Multi-level caching can be used wherein multiple cache levels (e.g., L1, L2, L3) are successively defined along a pipeline memory structure of the device. If requested data is resident in a selected cache level, the data can be quickly retrieved for use by the controller (a cache hit), thereby eliminating the latency required to access the slower main memory to retrieve the requested data.

SUMMARY

Various embodiments of the present invention are generally directed to a non-volatile resistive sense memory on-chip cache.

In accordance with some embodiments, an apparatus generally comprises a first semiconductor substrate on which is formed a processing circuit. A second semiconductor substrate is affixed to the first semiconductor substrate to form an encapsulated integrated chip package, wherein a non-volatile storage array of resistive sense memory (RSM) cells is formed on the second semiconductor substrate to cache data used by the processing circuit.

These and various other features and advantages which characterize the various embodiments of the present invention can be understood in view of the following detailed discussion in view of the accompanying drawings.

BRIEF DESCRIPTION OF THE DRAWINGS

FIG. 3 shows an exemplary construction of a resistive sense memory (RSM) cell characterized as a spin-torque transfer random access memory (STTRAM or STRAM) cell.

FIG. 4 shows an exemplary construction of a resistive sense memory (RSM) cell characterized as a resistive random access memory (RRAM) cell.

FIG. 5 sets forth a representation of a memory hierarchy of the exemplary device of FIG. 1.

DETAILED DESCRIPTION

Figure 1:
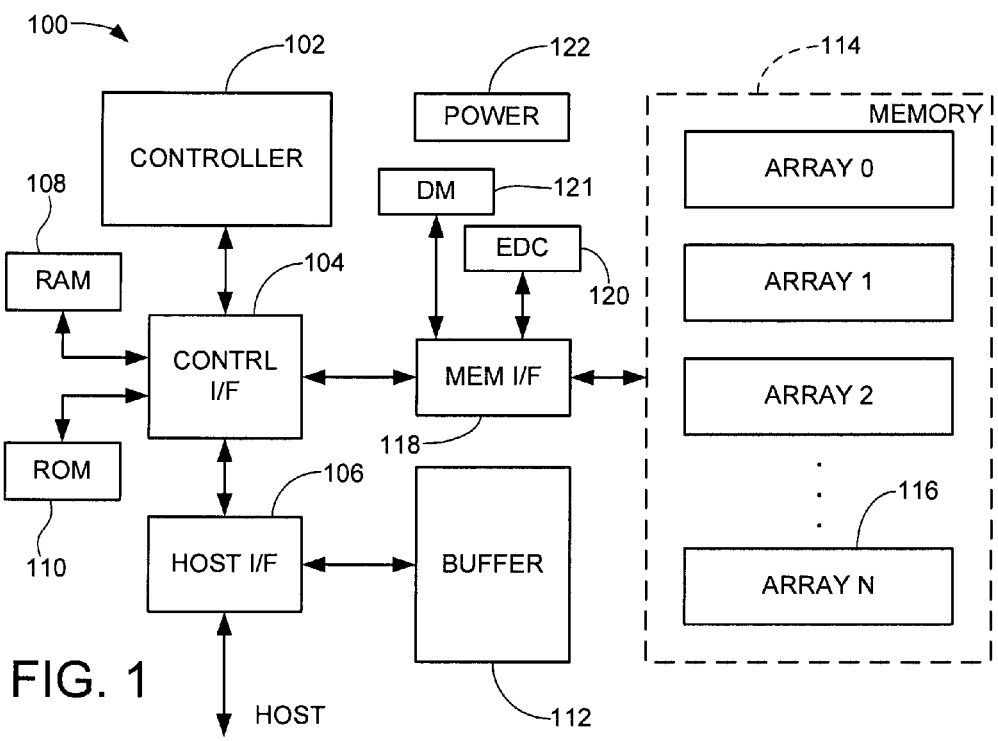
FIG. 1 is a functional representation of an exemplary data storage device constructed and operated in accordance with various embodiments of the present invention.

FIG. 1 provides a functional block representation of a data storage device 100 constructed and operated in accordance with various embodiments of the present invention. Top level control of the device 100 is carried out by a suitable controller 102, which may be a programmable or hardware based microcontroller. The controller 102 communicates with a host device via a controller interface (I/F) circuit 104 and a host I/F circuit 106. In some embodiments of the present invention, the host device can be a processing circuit such as a CPU.

Local storage of requisite commands, programming, operational data, etc. can be provided as desired via random access memory (RAM) 108 and read-only memory (ROM) 110. A buffer 112 serves to temporarily store input write data from the host device and readback data pending transfer to the host device, as well as to facilitate serialization/ deserialization of the data during a transfer operation. The buffer can be located in any suitable location, including in a portion of the array.

A memory space is shown at 114 to comprise a number of memory arrays 116 (denoted Array 0-N), although it will be appreciated that a single array can be utilized as desired. Each array 116 preferably comprises a block of semiconductor memory of selected storage capacity. Communications between the controller 102 and the memory space 114 are coordinated via a memory (MEM) I/F 118. As desired, on-the-fly error detection and correction (EDC) encoding and decoding operations are carried out during data transfers by way of an EDC block 120, and defect management (DM) functions are carried out by block 121.

While not limiting, in an embodiment the various circuits depicted in FIG. 1 are arranged as a single chip set formed on one or more semiconductor dies with suitable encapsulation, housing and interconnection features (not separately shown for purposes of clarity). Input power to operate the device is handled by a suitable power management circuit 122 and is supplied from a suitable source such as from a battery, AC power input, etc. Power can also be supplied to the device 100 directly from the host.

Any number of data storage and transfer protocols can be utilized, such as logical block addressing (LBAs) whereby data are arranged and stored in fixed-size blocks (such as 512 bytes of user data plus overhead bytes for ECC, sparing, header information, etc). Host commands can be issued in terms of LBAs, and the device 100 can carry out a corresponding LBA-to-PBA (physical block address) conversion to identify and service the associated locations at which the data are to be stored or retrieved. These and other features will be discussed in detail below.

Figure 2:
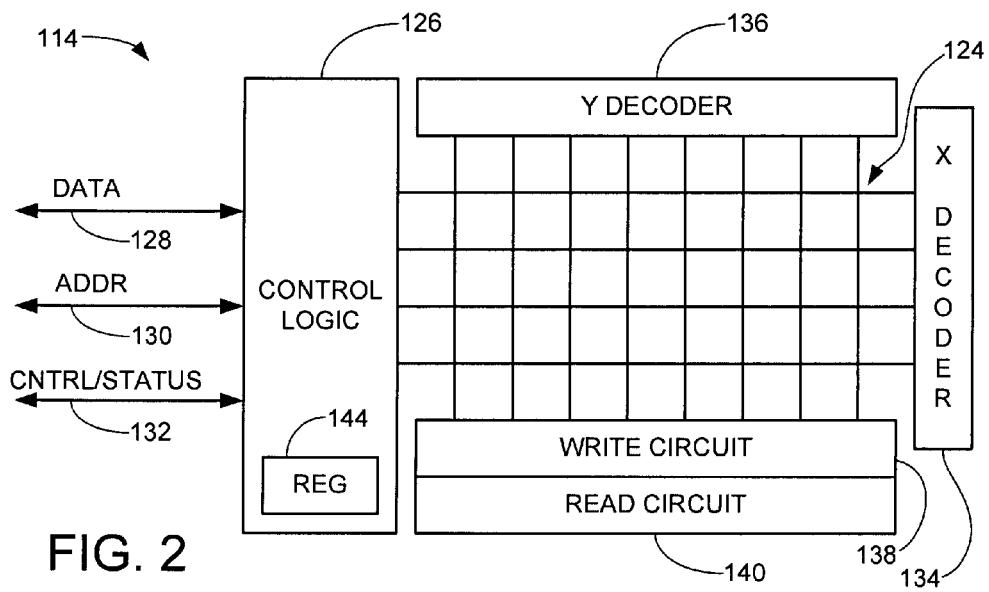
FIG. 2 shows circuitry used to read data from and write data to a memory array of the device of FIG. 1.

FIG. 2 provides a generalized representation of selected aspects of the memory space 114 of FIG. 1. Data are stored in each array as an arrangement of rows and columns of memory cells 124, accessible by various row (word) and column (bit) lines, etc. The actual configurations of the cells and the access lines thereto will depend on the requirements of a given application. Generally, however, it will be appreciated that the various control lines will generally include enable lines that selectively enable and disable the respective writing and reading of the value(s) of the individual cells.

Control logic 126 receives and transfers data, addressing information and control/status values along multi-line bus paths 128, 130 and 132, respectively. X and Y decoding circuitry 134, 136 provide appropriate switching and other functions to access the appropriate cells 124. As desired, adjacent arrays can be configured to share a single Y (row) decoder 136 to reduce RC delay effects along an associated word line.

A write circuit 138 represents circuitry elements that operate to carry out write operations to write data to the cells 124, and a read circuit 140 correspondingly operates to obtain readback data from the cells 124. Local buffering of transferred data and other values can be provided via one or more local registers 144. At this point it will be appreciated that the circuitry of FIG. 2 is merely exemplary in nature, and any number of alternative configurations can readily be employed as desired depending on the requirements of a given application.

The memory cells 124 are characterized as so-called resistive sense memory (RSM) cells. As used herein, RSM cells are generally described as cells configured to have different electrical resistances which are used to store different logical states. The resistance of the cells can be subsequently detected during a read operation by applying a read current and sensing a signal in relation to a voltage drop across the cell. Exemplary types of RSM cells include resistive random access memory (RRAM), magnetic random access memory (MRAM), spin-torque transfer random access memory (STTRAM or STRAM), etc.

Advantages of RSM cells over other types of non-volatile memory cells such as EEPROM and flash include the fact that no floating gate is provided in the cell construction. No erase operation is necessary prior to the writing of new data to an existing set of cells. Rather, RSM cells can be individually accessed and written to any desired logical state (e.g., a "0" or "1") irrespective of the existing state of the RSM cell. Also, write and read power consumption requirements are substantially reduced, significantly faster write and read times can be achieved, and substantially no wear degradation is observed as compared to erasable cells, which have a limited write/erase cycle life.

FIG. 3 shows an STRAM cell 150. The STRAM cell 150 includes a magnetic tunneling junction (MTJ) formed from two ferromagnetic layers 152, 154 separated by an oxide barrier layer 156 (such as magnesium oxide, MgO). The resistance of the MTJ 150 is determined in relation to the relative magnetization directions of the ferromagnetic layers 152, 154: when the magnetization is in the same direction, the MTJ is in the low resistance state ($R_L$); when the magnetization is in opposite directions, the MTJ is in the high resistance state ($R_H$).

In some embodiments, the magnetization direction of the reference layer 152 is fixed by coupling to a pinned magnetization layer (e.g., a permanent magnet, etc.), and the magnetization direction of the free layer 154 can be changed by passing a driving current polarized by magnetization in the reference layer 152.

To read the logic state stored by the MTJ, a relatively small current is passed through the MTJ between a source line (SL) and a bit line (BL). Because of the difference between the low and high resistances of the MTJ in the respective logical 0 and 1 states, the voltage at the bit line will be different, which can be sensed using a suitable sense amplifier. A switching device 158 allows selective access to the MTJ during read and write operations.

FIG. 4 illustrates an RRAM cell 160 as an alternative RSM cell construction. The RRAM cell 160 includes opposing electrode layers 162, 164 and an oxide layer 166. The oxide layer 166 may be configured to have a nominally high resistance (e.g., $R_H$). The resistance of the oxide layer, however, can be lowered (e.g., $R_L$) through application of a relatively high write voltage across the RRAM cell 160. Such voltage generates lower resistance paths (filaments) as components of a selected electrode layer 162, 164 migrate into the oxide layer 166.

The oxide layer 166 can be restored to its original, higher resistance through application of a corresponding voltage of opposite polarity. As with the STRAM cell 150 of FIG. 3, the storage state of the RRAM cell 160 of FIG. 4 can be read by passing a read current from a source line (SL) to a bit line (BL), and sensing the resistance of the cell in a manner such as shown in FIG. 4. A switching device 168 facilitates access to the RRAM cell.

FIG. 5 generally illustrates an exemplary memory hierarchy for a data storage device such as the device 100 of FIG. 1. Generally, various types of memories of different capacity and character are arranged to form a pipeline memory structure 170. The memory hierarchy increases processing efficiencies of the CPU 102, provides substantially instant on/off operations, and reduces power consumption over conventional volatile or non-volatile designs.

The pipeline 170 generally includes a register file 172, a cache array 174, direct access random access memory (RAM, such as volatile DRAM) 176, and non-volatile main memory 178. These respective elements can be variously mapped to the device 100 of FIG. 1; for example, the cache array can be incorporated on-chip with the controller 102 and/or located elsewhere, including but not limited to the buffer 112. The RAM 176 can correspond to the RAM 108 in FIG. 1, or can be provisioned elsewhere.

The non-volatile main memory 178 can correspond to the main memory space 114 of FIG. 1, although other configurations are readily envisioned. For example, in an alternative embodiment a head-disc interface (HDI) one or more rotatable magnetic media can be provided to serve as the main memory 178 in addition to, or in lieu of, a semiconductor memory.

A plurality of hierarchical cache levels are used for the cache array 174, such as first, second and third cache levels 180, 182 and 184(L1, L2 and L3). Some embodiments use dual L1 caches, one to store instructions (L1-I) and another to store data (L1-D). Other arrangements can also be utilized.

During operation, data utilized by the CPU 102 are normally stored in local register files (172, FIG. 5) that are issued into the pipeline 170 for execution as needed. Generally, if the CPU 102 requests selected data during a data retrieval operation, if not available locally a methodical search process will be initiated whereby successive elements of the pipeline 170 will be checked to see of the selected data are resident therein.

For example, if L1 cache 180 does not have the selected data, the L2 cache 182 will be checked, and so on until the selected data is located and retrieved. Such retrieval may ultimately require an access operation upon the main memory 178. As used herein, a so-called cache hit involves retrieval of the data from a source along the pipeline 170 other than the main memory 178. Cache hits are generally desirable since retrieving the data from the main memory 178 can invoke a relatively long latency period, require bus negotiation and access, additional overhead processing by the CPU 102 to effect the transfer, etc.

At this point it will be appreciated that the various aspects of the pipeline 170 can be constructed from volatile memory elements. Generally, a volatile pipeline provides certain advantages including enhanced access speed (i.e., can accommodate very high clock rates, etc.).

However, a disadvantage of a volatile pipeline is that, upon a power down condition, all data in the pipeline are lost. Thus, to resume an operational state, the contents of the various storage locations along the pipeline generally require repopulation, such as from main memory. This can be a costly penalty with regard to latency delay to place the device in an operationally ready mode and resume operation at the point prior to the power down. Depending on the technology, volatile pipelines can also have generally unfavorable power and/or heat generation characteristics, particularly with DRAM which require continuous refresh cycles to maintain data retention.

Figure 6:
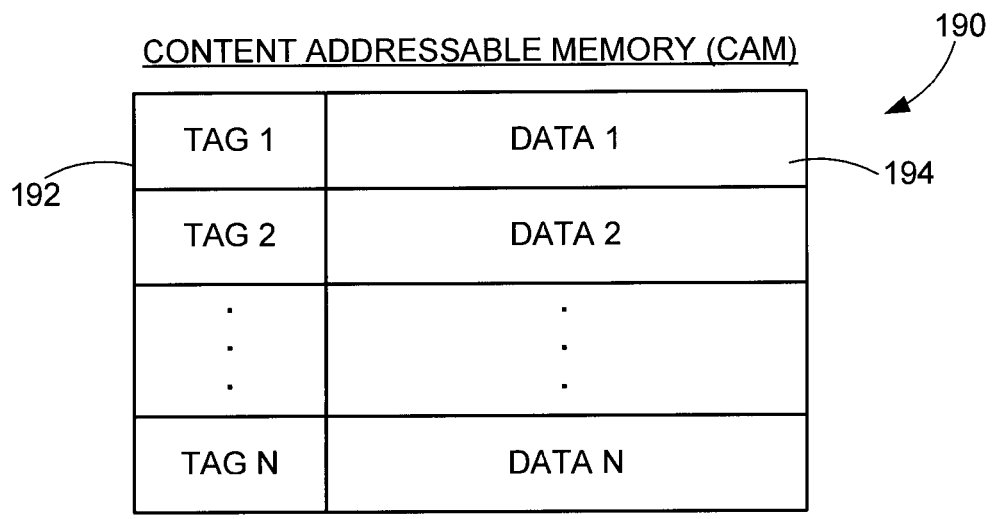
FIG. 6 shows a general format for a content addressable memory (CAM) structure.

FIG. 6 sets forth a generalized format for an associative memory 190 having a content addressable memory (CAM) configuration. CAM based associative memories have found widespread use in a number of applications such as computer system cache, network routers, and various embedded applications.

The memory 190 is arranged to have a number of lines (rows) each with an index field 192 and a word data field 194. The index field 192 stores tag data which serves as an identifier for the associated word data in field 194. The tag data can take any number of desired forms, and can be expressed as a multi-bit value associated with some other address of the word data (such as a block address in another location in memory, such as the main memory 178).

The memory 190 is generally accessed during a data retrieval operation by providing input search data which is quickly compared to the tag data in the respective index fields 192. When a match is found, the corresponding word data from the associated word data field 194 is output. Depending on the size and arrangement of the memory 190, the search can be executed over a single clock cycle, making the CAM structure faster than many other hardware or software based search systems.

Figure 7:
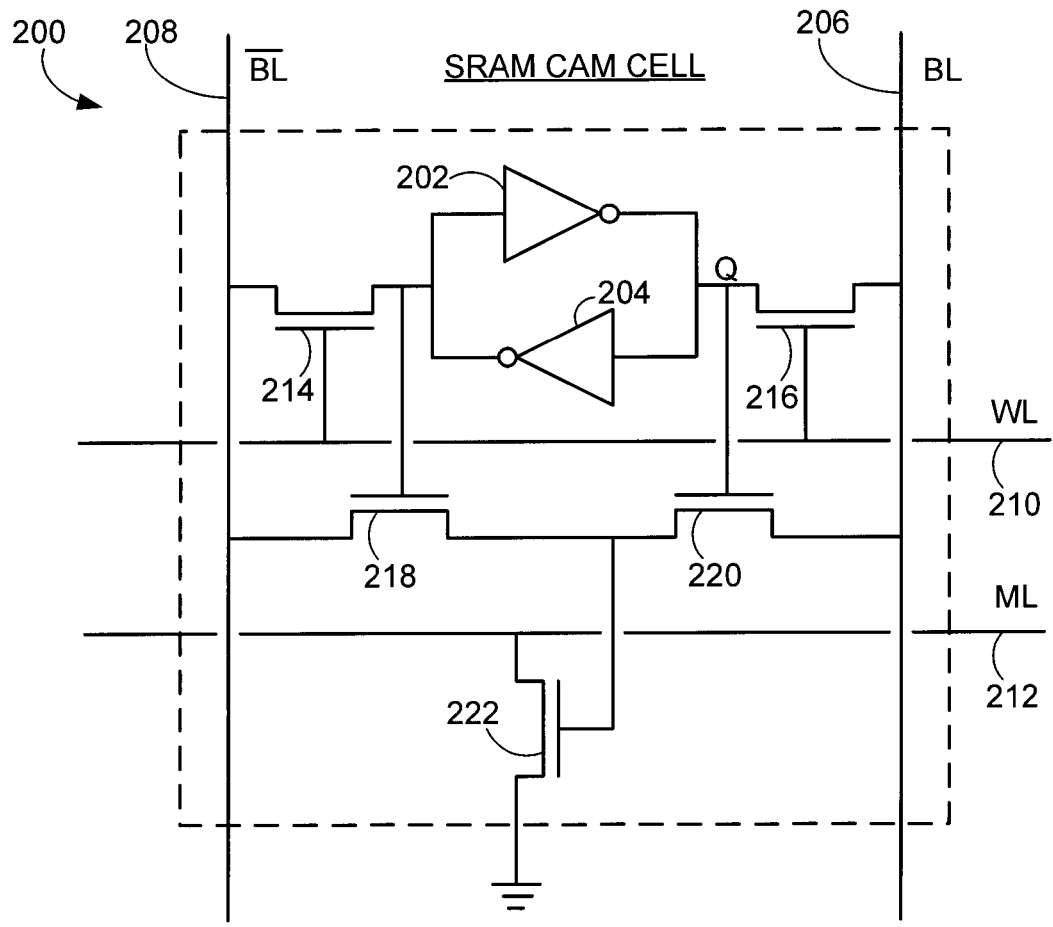
FIG. 7 depicts an SRAM based CAM cell.

FIG. 7 provides a schematic depiction of an SRAM based CAM cell 200. It will be appreciated that the CAM cell 200 is arrayed into an array of such cells to store tag data such as depicted in FIG. 6. Each CAM cell 200 is volatile in that it retains a storage bit (Q) only so long as power continues to be applied to the cell.

The exemplary CAM cell 200 in FIG. 7 takes a general nine-transistor (9T) configuration, in that five transistors are shown in FIG. 7 and cross-linked inverters 202, 204 are formed from an additional four transistors. Other configurations for the volatile CAM cell 200 can be utilized including static cell configurations with fewer or greater numbers of transistors or other circuit elements, dynamic configurations that utilize refresh cycles to continuously rewrite the stored value, etc.

Input lines coupled to the CAM cell 200 include two bit lines 206, 208 (denoted BL and BL), a word line (WL) 210 and a match line (ML) 212. Access transistors 214, 216 are respectively coupled between the inverters 202, 204 and the bit lines 206, 208 to form an SRAM memory cell. Switching transistors 218, 220 and 222 selectively couple the cell to the ML 212 during search operations.

Writing a state of the CAM cell 200 generally involves applying the desired value to the respective bit lines 206, 208. For example, to write a logical 0, a 0 (low) is applied to BL 206 and a 1 (high) is applied to BL 208. The word line WL 210 is asserted high to place the access transistors 214, 216 in a conductive state, and the desired value is stored at node Q.

During a search operation, the ML 212 is charged high, and input compare data are placed on the bit lines BL, BL 206, 208. A mismatch will turn on transistor 222, pulling the ML 212 low. An encoder (not shown) processes the match lines from the array of CAM cells 200 and identifies the specific word data storage that corresponds to the identified match.

An alternative SRAM CAM cell configuration can omit the transistors 218, 220 and 222, and instead use a conventional six transistor (6T) configuration to store the tag data. To read the data stored by the cell, the respective bit lines BL, BL 206, 208 can be charged high and the word line WL 210 can be asserted. If a logical 1 is stored at Q, the BL line 208 will discharge and BL will remain high, and vice versa. Downstream logic can compare the respective bit line values to the input value to identify a tag match.

Figure 8:
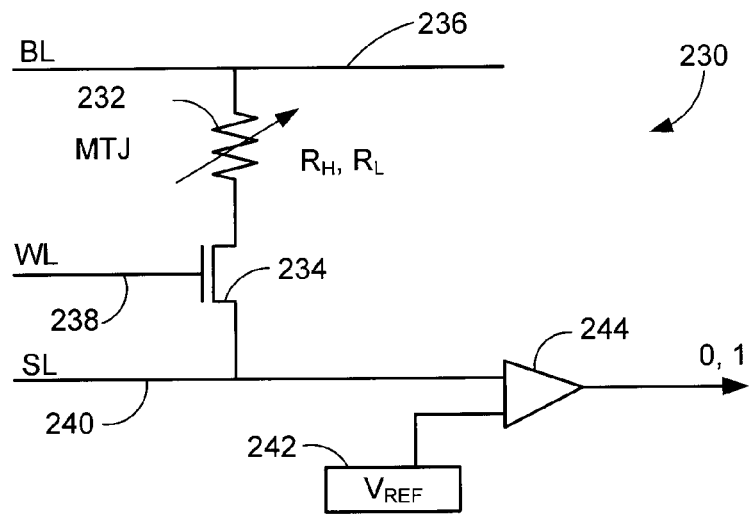
FIG. 8 depicts an RSM based CAM cell.

FIG. 8 shows a schematic representation for an RSM based CAM cell 230 constructed and operated in accordance with various embodiments of the present invention. For purposes of providing a concrete illustration, it is contemplated that the cell 230 utilizes an STRAM cell such as 150 in FIG. 3, although such is not limiting as other types of RSM cell constructions can be utilized. Because of the fewer number of circuit elements, and because transistors currently can contribute significantly to the overall size of a given cell, it will be appreciated that the RSM cell 230 can have a substantially reduced footprint size compared to the various SRAM cells discussed above. Other advantages, including reduced leakage current and heat generation, can also be achieved as discussed below.

The exemplary cell 230 includes an MTJ 232 connected in series with a switching transistor 234. Other configurations are readily contemplated, however, including a NAND configuration wherein each switching transistor 234 is connected in parallel with the associated MTJ 232 for a block of such serially connected cells 230, which are then accessed sequentially.

To read the storage state (resistance level) of the MTJ 232, a bit line (BL) 236 is charged high and a word line (WL) 238 is asserted, to place the switching transistor 234 in a conductive state. A voltage drop across the MTJ 232 to a source line (SL or BL) 240 will be determined in relation to the programmed high or low resistance state ($R_H$ or $R_L$) of the MTJ. The voltage on the SL 240 can be compared to a reference voltage $V_{REF}$ from source 242 using a sense amplifier 244 to output the logic state of the cell 230.

While the cell 230 is contemplated as storing a single bit, multi-bit storage configurations can alternatively be used as desired through the use of multiple resistance levels and corresponding reference voltage values.

Figure 9:
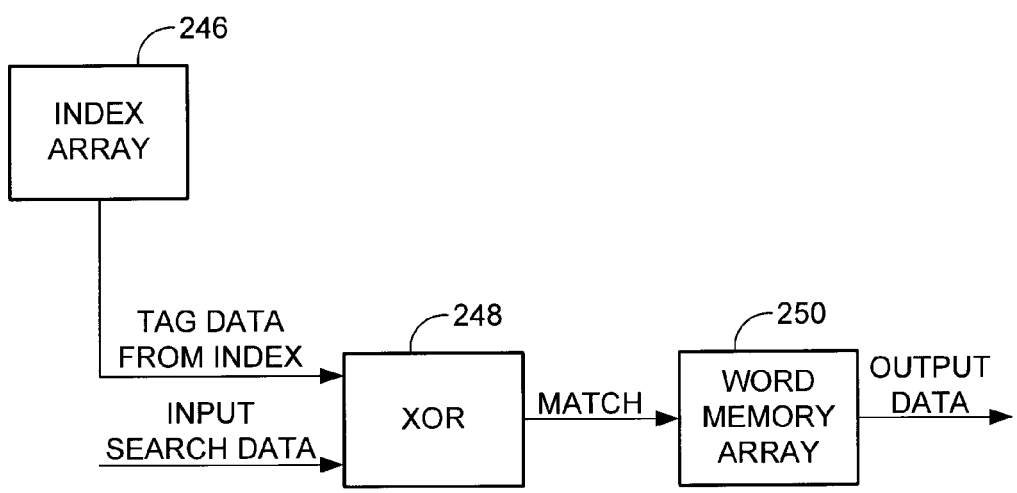
FIG. 9 shows decode logic used during a search operation using the RSM based CAM cells of FIG. 8.

FIG. 9 shows an index array 246 formed from an array of RSM cells 230 from FIG. 8. The cells 230 in the index array 246 are arranged in appropriate blocks, such as rows or columns, to correspond to the tag fields 192 in FIG. 6. As exemplified in FIG. 9, the tag data read from the index array 246 is compared to input search data supplied to the device 190, such as through the use of an exclusive or (XOR) block 248, to determine whether there is a match between the respective sets of data. If so, a cache hit occurs and the requested data are output from an associated word memory array 250, which corresponds to the word fields 194 of FIG. 6. It is contemplated that the foregoing approach can achieve read performance comparable to, or even exceeding, that for the SRAM based CAM cells of FIG. 7.

Figure 10:
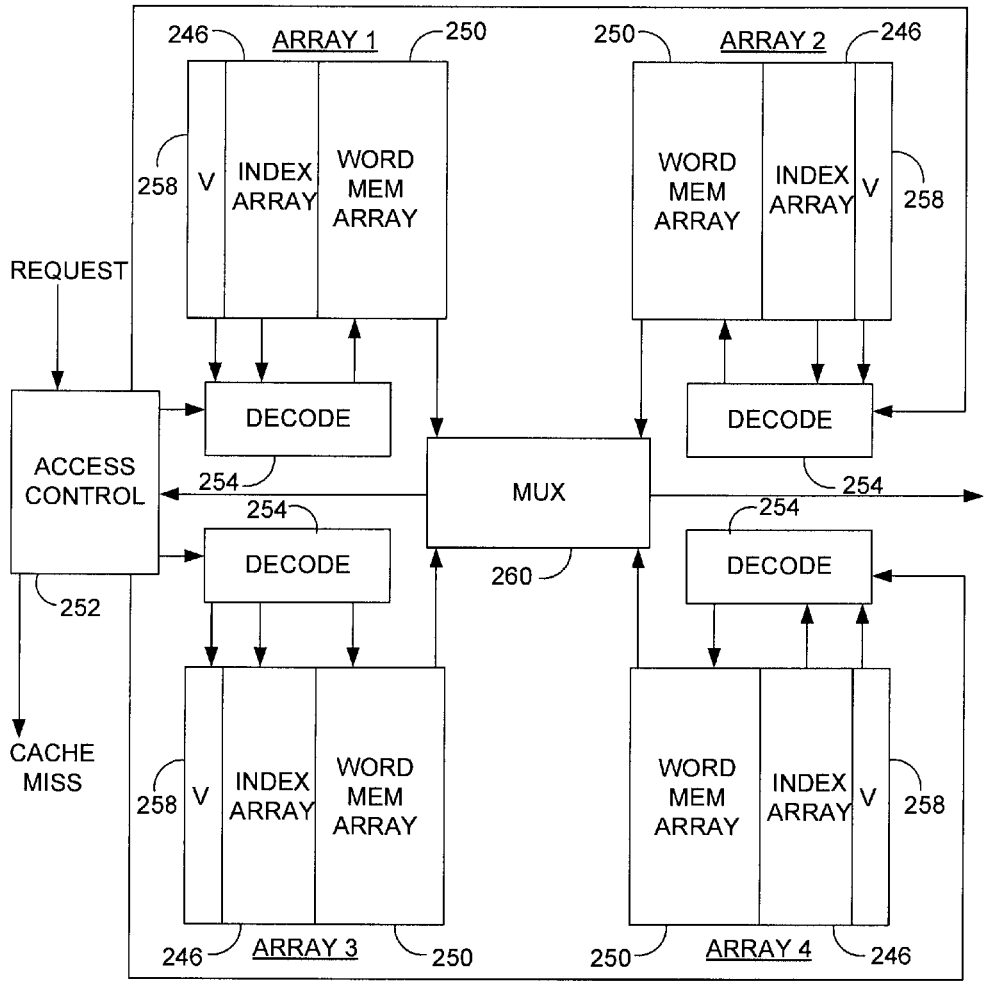
FIG. 10 is a block diagram for a four-way associative CAM device in accordance with various embodiments of the present invention.

FIG. 10 provides a block representation of the memory device 190 of FIG. 6 as a four-way associative memory structure. For purposes of the present discussion, it will be contemplated that the device 190 in FIG. 10 serves as the L2 cache (182, FIG. 5) for a host CPU or other controller with a total word data storage capacity of 4 MB.

The cache 190 is divided into four memory modules (Arrays 1-4), each representing one-way; that is, the total memory space is divided into fourths, and the blocks (LBAs, etc.) in each fourth are separately mappable to a respective one of the modules.

During a cache access operation, an input request is provided to an access control block 252. The control block 252 directs access to all four of the modules via decode blocks 254 in search thereof. It will be appreciated that at most, only one of the modules will have the target data.

The decode blocks 254 access the associated index arrays 246 for each module, as well as a valid (V) flag for each entry (valid arrays 258) signifying whether the associated entry has a valid state. When a match is found between the input search data and the tag data, as discussed previously in FIG. 9, a central multiplexor (mux) 260 connects the appropriate lines to facilitate output of the requested data. If no match is found, a cache miss output is provided, allowing the system to query the next device in the pipeline 170 (FIG. 5).

Figure 11:
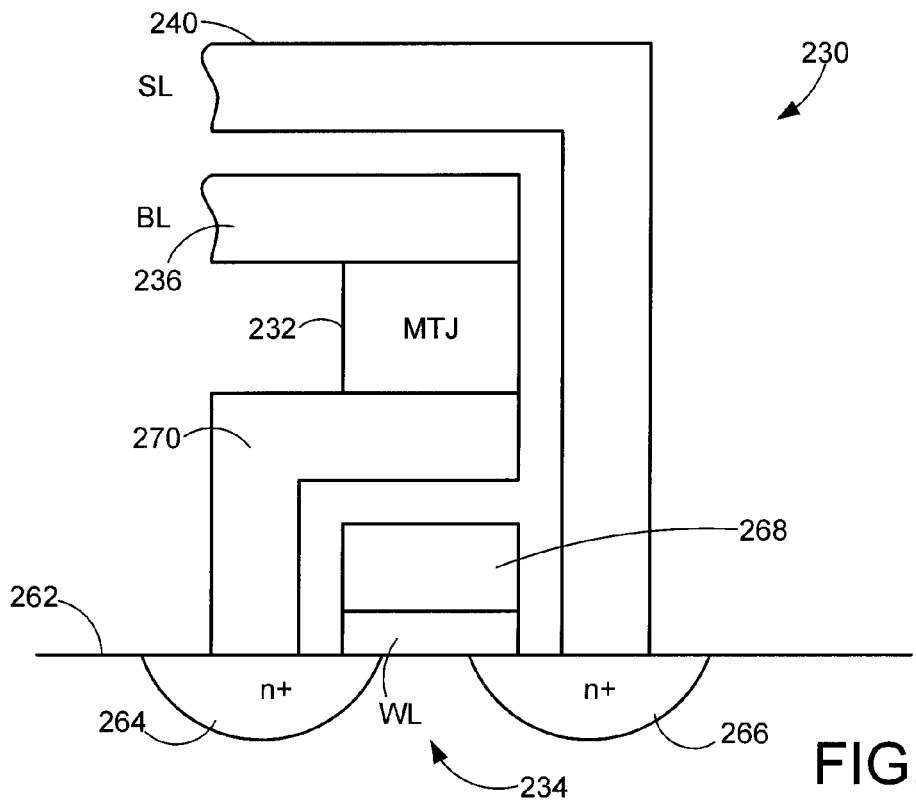
FIG. 11 sets forth a side elevational representation of an exemplary cell from FIG. 8.

FIG. 11 shows an exemplary construction for the respective RSM CAM cells 230 of FIG. 8 used to form the index arrays 246. As desired, a similar construction can be used for other elements of the exemplary memory device 190, such as the word memory arrays 250 and the valid arrays 258.

FIG. 11 shows a base semiconductor layer 262 in which localized regions 264, 266 of n+ doped material are formed. An isolated control gate 268 spans the respective regions 264, 266 to form the switching transistor 234 (FIG. 8). The word line WL 238 (FIG. 8) is not expressly shown but is understood to connect to the control gate 268. A support structure 270 extends from the region 264 to support the MTJ 232 or an alternative RSM module (RRAM, etc.). The bitline BL 236 is coupled to the MTJ 232, and the source line SL 240 is coupled to the region 266.

It will be appreciated that the structural configuration of FIG. 11 is merely exemplary in nature, and is not limiting in that any number of alternative configurations can be utilized. In some embodiments, a 70 nm or smaller fabrication process technology is used, and each cell generally obtains a size on the order of about $4F^2$ or $6F^2$. In other embodiments, existing analogous fabrication technologies and layouts are used (as modified to accommodate an RSM cell), such as DRAM, embedded DRAM (eDRAM), etc. As noted above, this provides a significant improvement from an overall footprint size as compared to existing technologies, such as SRAM based CAM cells.

Computer simulations have determined that in some microprocessor designs, the impact of write operation latency on system performance to write RSM CAM cells can be relatively minimal. An exception can be found in read-after-write conflicts, but such occur relatively infrequently. Indeed, in many cases it was found that the write latency of RSM based cache could be ignored entirely, as such had no identifiable impact on overall performance during such simulations. Hence, any longer write latencies that may be associated with the RSM based cells (due to longer bit line charging delays, etc.) embodied herein would be expected to have little or no impact on processor performance.

Such simulations further showed that read latencies can have some measurable impact on system performance. Such impact, however, may be different for different levels of cache hierarchy. For a lower level cache (such as L2 or L3), any impacts on read latencies can be relatively small, and cache memory capacities, area overhead and power consumption may be more important factors in a particular design.

For example, in some microprocessors, more than 50% of the total chip area can be occupied by cache. In addition to the area overhead, such cache can consume large amounts of power, and much of this may be attributable to leakage power. Generally, the 20 cache can consume about 30-70% of total CPU power, and doubling the size of the L3 cache can increase total CPU power by more than 50%.

Table 1 sets forth simulated performance degradation due to read latency increases in an L2 cache with STRAM based CAM cells. The simulation results set forth in Table 1 are for an exemplary 8-way, 4 MB L2 cache with 333 psec (10-12 sec) clock period and 26 SPEC2K benchmarks.

TABLE 1

|  | L2 Read Latency (cycles) | | | |
| --- | --- | --- | --- | --- |
|  | 12 | 15 | 17 | 20 |
| Normalized Performance | 1.00 | 1.01 | 1.02 | 1.02 |

From Table 1 it can be seen that substantial increases in read latency for the cache (e.g., from 12 cycles to 20 cycles) only degraded normalized performance of the processor by about 2%. The normalized performance values in Table 1 were obtained by dividing each of the simulation result values by the value obtained for the 12 cycle configuration.

It is also noted that in existing CPU devices, the leakage power from SRAM cache cells can contribute up to or more than 90% of total cache power, with further increases with further scale reductions in manufacturing technology. By contrast, STRAM cells (and other RSM based cells) provide substantially reduced leakage current in standby mode, so replacing SRAM based cells with STRAM cells (or other RSM based cells) can significantly reduce cache leakage power, and hence, the total CPU power. Thus, the RSM based caches as exemplified herein will continue to gain improved power benefits while maintaining reasonable tradeoffs on system performance degradations in the future.

Figure 12:
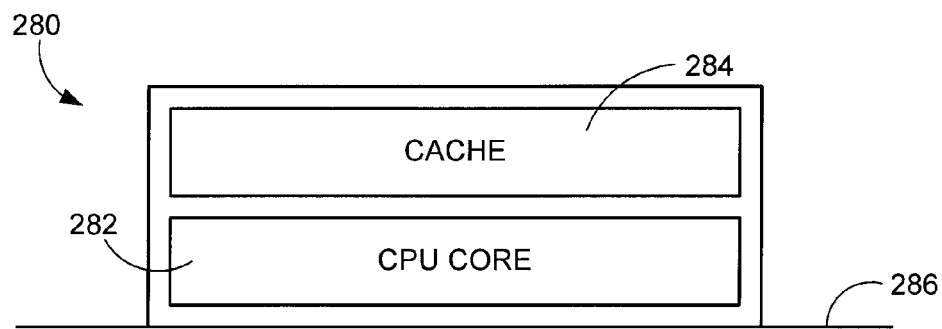
FIG. 12 is a side view of a multi-substrate device with a processing semiconductor substrate and a cache semiconductor substrate.

Additional benefits of RSM based caches (and other memory structures) as embodied herein are related to the use of 3D applications. FIG. 12 shows a multi-substrate integrated circuit package (chip) 280, formed from a first semiconductor substrate 282 and a second semiconductor substrate 284. As used herein, the term "semiconductor substrate" refers to a multi-layer processed semiconductor object with defined functionality configured to mate with one or more other substrates with different functionality which are encapsulated to form an overall integrated circuit package.

In one embodiment, a CPU core or other processing circuit, such as the CPU 102 and L1 cache 180 of FIG. 5, are formed on the first semiconductor substrate 282. The L2 cache 182 of FIG. 5 can be formed on the second semiconductor substrate 284 and used to cache data used by the processing circuit of the first semiconductor substrate 282. Alternatively, the first semiconductor substrate 282 could house the CPU core, or the CPU core, L1 cache, and the L2 cache. The second semiconductor substrate 284 could house only the L1 cache or some combination of the L1, L2 and L3 caches. Other configurations, including configurations with additional layers, and substrates with multiple cache levels, are readily contemplated.

One advantage of the configuration of FIG. 12 is that the cache layer (e.g., substrate 284) does not constitute the largest source of heat generation, as can be found in the prior art. Accordingly, in some embodiments the processing substrate 282 is advantageously located proximate the closest heat sink source, such as heat reducing layer 286. The layer 286 can constitute an active heat reducing element (such as a thermoelectric cooler), a passive heat sink, a PC board or other structure through which heat can be dissipated efficiently, etc.

Figure 13:
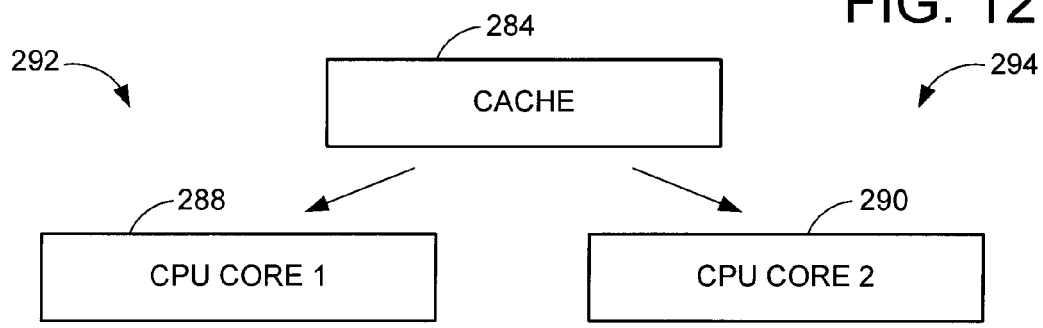
FIG. 13 generally illustrates compatibility of the cache semiconductor substrate with different processing semiconductor substrates.

Another advantage of the configuration of FIG. 12 is that the second semiconductor substrate 284 can be readily configured to be interchangeable with different processing semiconductor substrates 288, 290 to form different encapsulated chips 292, 294, as shown in FIG. 13. For example, the substrate 288 could incorporate a processor design X whereas the substrate 290 could incorporate a different processor design Y. By standardizing the cache substrates 284, nominally identical cache substrates could be respectively mated to different processing substrates fabricated by different facilities and or technologies to form a number of different final encapsulated integrated chip packages.

Figure 14:
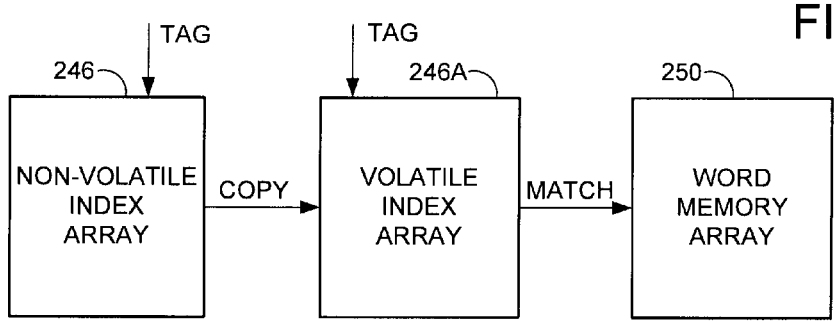
FIG. 14 provides an alternative embodiment for the configuration of FIG. 10.

Referring to FIG. 14, another alternative embodiment is shown for the memory device in FIG. 10. In FIG. 14, each of the arrays 1-4 of FIG. 10 includes the aforedescribed non-volatile index array 246 formed of RSM cells 230. In addition, each array in FIG. 14 includes a corresponding volatile index array 246A formed of volatile CAM cells, such as the SRAM based cell 200 of FIG. 7. Generally, this embodiment can further provide increased advantages of lower power consumption/heat generation and non-volatility of the cache while providing, as necessary, further increases in write or read (search) latencies.

Generally, the access control block 252 (FIG. 10) is further configured in this embodiment to write the input tag data to both the non-volatile and volatile index arrays 246, 246A when a new entry is added to the device. Searches for cache hits are carried out by referencing the volatile index array 246A (as discussed above with respect to FIG. 7). Upon a device reinitialization operation, the tag data contents of the non-volatile index array 246 are copied over to the volatile index array 246A.

It will now be appreciated that the various embodiments presented herein provide advantages over various prior art structures. Non-volatile resistive sense memory structures as embodied herein can be provided with overall system access latencies in the range of SRAM or similar volatile technologies to provide acceptably fast cache searches and writes. The non-volatility allows data retention along a pipeline to improve instant-on performance of the overall system, while significantly reducing power consumption and heat generation levels.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. An apparatus comprising a 3D encapsulated integrated chip package adapted to communicate with a separate non-volatile main memory, the package comprising a first semiconductor substrate on which is formed a processing circuit, and a second semiconductor substrate affixed to the first semiconductor substrate to form an axially aligned stack of said substrates within said package, wherein a non-volatile resistive sense memory (RSM) on-chip cache memory is formed on the second semiconductor substrate, the cache memory comprising a non-volatile word memory array of RSM cells, a non-volatile index array formed of RSM cells, and a volatile index array formed of volatile memory cells, wherein the RSM cells of the non-volatile word memory array are adapted to locally cache word data which are used by the processing circuit and separately stored on the main memory, the RSM cells of the non-volatile index array are adapted to store tag data associated with the word data cached in the non-volatile word array, and the tag data are concurrently stored in the respective non-volatile index array and the volatile index array, wherein the tag data stored in the non-volatile index array are copied to the volatile index array upon a reinitialization operation, and the second semiconductor substrate does not have volatile memory cells capable of storing a copy of the word data in the non-volatile word array, wherein the cache memory is configured as an L2 cache for the processing circuit, wherein the processing circuit generates a greater amount of heat than the L2 cache, and the first and second semiconductor substrates are respectively ordered within the package to place the first semiconductor substrate closer to an external heat sink than the second semiconductor substrate, the external heat sink separate from the package and adapted to provide a primary heat conduction path to remove heat generated during operation of the package.

2. The apparatus of claim 1, wherein the RSM cells of the word memory array each comprise a spin-torque transfer random access memory (STRAM) cell comprising a magnetic tunneling junction (MTJ) and a switching device, the MTJ having at least one reference layer and at least one free layer adapted to store a selected data state responsive to a relative magnetic orientation of the free layer to the reference layer, the switching device operable to provide read access to the selected data state responsive to an input control signal.

3. The apparatus of claim 1, wherein the RSM cells of the word memory array each comprise a resistive random access memory (RRAM) cell comprising first and second conductive layers separated by an intermediary layer programmable to a selected data state responsive to component migration effects, the RRAM cell further comprising a switching device operable to provide read access to the selected data state responsive to an input control signal.

4. The apparatus of claim 1, wherein the processing circuit of the first semiconductor substrate comprises a central processing unit (CPU) core and an L1 cache, and wherein the CPU is adapted to search the L1 cache for a selected instruction, and to search the word memory array of the L2 cache for said instruction responsive to a cache miss on the L1 cache.

5. The apparatus of claim 1, wherein the external heat sink is characterized as an active heat reducing element to which electrical power is supplied to remove heat from the package.

6. The apparatus of claim 5, in which the respective first and second substrates each have respective length, width and thickness dimensions the respective thickness dimensions being less than the respective length and width dimensions, the axial alignment of the first and second seminconductor substrates within the axial stack place the respective length and width dimensions in facing relation, and the external heat sink is affixed to the encapsulated integrated chip package on a side in facing relation to the length and width dimensions of the first semiconductor substrate so that the first semiconductor substrate is between the primary heat sink source and the second semiconductor substrate.

7. The apparatus of claim 1, wherein the non-volatile RSM on-chip cache memory of the second semiconductor substrate comprises a cache in a pipeline memory structure of a data storage device that further comprises said non-volatile main memory.

8. The apparatus of claim 1, wherein the second semiconductor substrate is standardized to interchangeably affix to a third semiconductor substrate on which is formed a second processing circuit with a hardware configuration different from the processing circuit of the first semiconductor substrate to form a different encapsulated integrated chip package.

9. An apparatus comprising a programmable processor formed on a first semiconductor substrate and a content addressable memory (CAM) structure for the programmable processor formed on a second semiconductor substrate affixed to the first semiconductor substrate to form an encapsulated integrated chip package, the CAM structure comprising a non-volatile word memory array formed of non-volatile resistive sense memory (RSM) cells, a non-volatile index array formed of non-volatile RSM cells, and a volatile index array formed of volatile memory cells, wherein the RSM cells of the non-volatile word memory are adapted to locally cache word data which are used b the programmable processor and separately stored on the main memory, the RSM cells of the non-volatile index array are adapted to store tag data associated with the word data cached in the non-volatile word array, wherein tag data are concurrently stored in both the non-volatile index array and the volatile index array responsive to the storage of word data in the non-volatile word memory array, wherein the tag data stored in the non-volatile index array are copied to the volatile index array upon a reinitialization operation, and wherein the word data are output by the non-volatile word memory array responsive to the programmable processor reading the associated tag data from the volatile index array, wherein the package is a 3D encapsulated integrated chip package adapted to communicate with a separate non-volatile main memory, the first and second semiconductor substrates forming an axially aligned stack of said substrates within said package, and wherein the apparatus further comprises an external heat sink affixed to the package on a side thereof closest to the first semiconductor substrate.

10. The apparatus of claim 9, wherein an L1 cache of memory cells is formed on the first semiconductor substrate for use by the programmable processor, wherein the CAM structure provides an L2 cache on the second semiconductor substrate for the programmable processor, wherein the programmable processor generates an amount of heat greater than an amount of heat generated by the L2 cache during operation of the package.

11. The apparatus of claim 10, wherein the external heat sink is characterized as an active heat reducing element to which electrical power is supplied to remove heat from the package.

12. A data storage device, comprising:
a non-volatile main memory adapted to store data from a host device coupled to the data storage device;
a buffer memory adapted to temporarily store data during data transfer operations between the main memory and the host device;
a controller coupled to the main memory and the buffer memory, the controller characterized as a 3D encapsulated integrated circuit package formed from axially aligned and stacked first and second semiconductor substrates within said package, wherein a central processing unit (CPU) core is formed on the first semiconductor substrate and a non-volatile resistive sense memory (RSM) on-chip cache memory is formed on the second semiconductor substrate, the cache memory comprising a non-volatile word memory array of spin-torque transfer random access memory (STRAM) cells adapted to store processing data used by the CPU core, a non-volatile index array of STRAM cells adapted to store tag data associated with the processing data stored in the word memory array, and a volatile tag array of volatile memory cells adapted to concurrently store a copy of the tag data in the non-volatile index array, wherein the tag data stored in the non-volatile index array are copied to the volatile index array upon a reinitialization operation, and the second semiconductor substrate does not have volatile memory cells capable of storing a copy of the word data in the non-volatile word array; and
a primary heat sink module affixed to the package on a side thereof closest to the CPU core to remove heat generated during operation of the data storage device.

13. The data storage device of claim 12, in which an L1 cache memory is further formed on the first semiconductor substrate for use by the CPU core, and the non-volatile RSM on-chip cache memory formed on the second semiconductor substrate is characterized as an L2 cache for the CPU core.

14. The data storage device of claim 12, wherein the primary heat sink module is a passive heat sink device affixed to the package.

15. The data storage device of claim 12, wherein the primary heat sink module is an active heat reducing element to which electrical power is supplied to remove heat from the package.

16. The data storage device of claim 12, in which the second semiconductor substrate is standardized to interchangeably affix to a third semiconductor substrate on which is formed a second CPU core with a hardware configuration different from the CPU core of the first semiconductor substrate to form a different encapsulated integrated chip package.

17. the data storage device of claim 12, in which the non-volatile resistive sense memory (RSM) on-chip cache memory is configured and operated as a four-way associative memory structure.

* * * * *